United States Patent
Liu

(10) Patent No.: US 10,290,239 B2
(45) Date of Patent: May 14, 2019

(54) FOLDABLE PANEL AND METHOD OF MANUFACTURING THEREOF

(71) Applicant: Wuhan China Star Optoelectronics Technology Co., Ltd., Wuhan, Hubei (CN)

(72) Inventor: Minlun Liu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 60 days.

(21) Appl. No.: 15/521,665

(22) PCT Filed: Mar. 20, 2017

(86) PCT No.: PCT/CN2017/077286
§ 371 (c)(1),
(2) Date: Apr. 25, 2017

(87) PCT Pub. No.: WO2018/161371
PCT Pub. Date: Sep. 13, 2018

(65) Prior Publication Data
US 2018/0286293 A1 Oct. 4, 2018

(30) Foreign Application Priority Data

Mar. 6, 2017 (CN) .......................... 2017 1 0128286

(51) Int. Cl.
*G09F 9/30* (2006.01)
*H05K 1/02* (2006.01)

(52) U.S. Cl.
CPC ............ *G09F 9/301* (2013.01); *H05K 1/028* (2013.01); *H05K 2201/055* (2013.01)

(58) Field of Classification Search
USPC .................................................. 361/749, 748
See application file for complete search history.

(56) References Cited

U.S. PATENT DOCUMENTS

| 2005/0185111 A1 | 8/2005 | Matsuoka |
| 2015/0084025 A1* | 3/2015 | Horiguchi ........... H01L 51/5253 257/40 |

(Continued)

FOREIGN PATENT DOCUMENTS

| CN | 102156360 A | 8/2011 |
| CN | 104103217 A | 10/2014 |

(Continued)

*Primary Examiner* — Andargie M Aychillhum
(74) *Attorney, Agent, or Firm* — Andrew C. Cheng

(57) ABSTRACT

This disclosure discloses a foldable panel, including a flexible display panel and a driver IC, the driver IC is arranged at a bonding end of a flexible substrate of the panel, and the bonding end is bent backward to the contrary direction of a light side of the panel, so that the driver IC is located at back side of the substrate; a thin film wiring layer connected between an active area and the driver IC is also arranged on the substrate, conductive wires are disposed on the thin film wiring layer for connecting the panel and the driver IC. This disclosure also discloses a method of manufacturing the foldable panel. By using the method, the active area proportion of the panel can be the maximum, this disclosure also ensures the circuit having good bending performance and avoids the use of COF and the risk of fracturing wires.

19 Claims, 3 Drawing Sheets

(56) References Cited

U.S. PATENT DOCUMENTS

2016/0179229 A1* 6/2016 Ahn .................. G06F 3/041
                                                                 345/173
2016/0374193 A1 12/2016 Namkung

FOREIGN PATENT DOCUMENTS

| CN | 204884440 U | 12/2015 |
| CN | 105353574 A | 2/2016 |
| CN | 106205394 A | 12/2016 |

* cited by examiner

FOLDABLE PANEL AND METHOD OF MANUFACTURING THEREOF

FIELD OF THE INVENTION

This disclosure relates to a flexible display technology, and in particular relates to a foldable panel and a method for manufacturing thereof.

THE RELATED ARTS

With the development of further advanced manufacturing equipment and material engineering technology, the applications of flexible, foldable, and curved display in electronic products have become increasingly abundant, it has brought huge profit opportunities for electronics manufacturers.

Flexible displays are the future highly competitive display technology, by mounting the flexible display media of electronic components and materials on a flexible material or a bendable substrate, so that the display has the characteristic of being bent or rolled into any shape and is characterized by being light-weighted, thin and portable, especially its foldability makes panel get a larger display area without occupying more space.

Due to the need for integration, one side of the VA (view area) of the flexible display panel is needed to reserve some space for the driver IC (integrated circuit), so that the proportion of the AA (active area) of the flexible display panel accounts for the entire plane is relatively small, how to increase the proportion of the AA becomes a more important technical issue.

SUMMARY

In view of the deficiencies of the prior art, this disclosure provides a foldable panel having high proportion of the active area and reliable structure, and its manufacturing method.

To achieve the above objectives, this disclosure uses the following technical solution:

A foldable panel, including a flexible display panel and a driver IC, the driver IC is arranged at a bonding end of a flexible substrate of the flexible display panel, and the bonding end is bent backward to a contrary direction of a light side of the flexible display panel, so that the driver IC is located at back of the flexible substrate; a thin film wiring layer connected between an active area and the driver IC is further arranged on the flexible substrate, one surface of the thin film wiring layer is provided with conductive wires connected to the flexible display panel and the driver IC respectively.

As one embodiment, the conductive wires are disposed at inner surface of the thin film wiring layer and opposite from the flexible substrate.

As one embodiment, the bonding end of the flexible substrate is arranged a plurality of first bonding terminals close to the active area and a plurality of second bonding terminals close to the driver IC, the number of the first and the second bonding terminals are the same, the first bonding terminals are connected the second bonding terminals one to one by the thin film wiring layer.

As one embodiment, at least two of the conductive wires are connected between each of the first and the second bonding terminals.

As one embodiment, the driver IC is directly bonded on the flexible substrate or is bonded on the flexible substrate by a flexible circuit board.

As one embodiment, a reinforcing plate is further bonded on the back side of the bonding end of the flexible substrate, the reinforcing plate at least covers back side of the driver IC where is disposed on the bonding end.

As one embodiment, the conductive wires are wavy shape.

Or, the conductive wires are chain structures formed of multiple conductive rings connected to each other.

As one embodiment, the connecting parts of two adjacent conductive rings of the conductive wires are staggered.

Another object is to provide a method of manufacturing the foldable panel according to the disclosure, including:

bonding the driver IC at the bonding end of the flexible substrate;

producing same number of first bonding terminals and second bonding terminals close to the active area and the driver IC respectively at the bonding end of the flexible substrate;

manufacturing a thin film wiring layer on the flexible substrate, and connecting conductive wires of the thin film wiring layer to corresponding ends of the first and the second bonding terminals respectively;

bend the bonding end, to make the driver IC locate on the back side of the flexible substrate.

In this disclosure, the thin film wiring layer is manufactured on the surface of the bonding end of the flexible substrate, the thin film wiring layer of the bonding end surface of the flexible substrate is used to achieve the electrical connection to the flexible display panel and the driver IC, and the bonding end is bent backward to the contrary direction of the light side to hide the driver IC at the back of the active area, so that the proportion of the active area of the panel can be the maximum; this disclosure also ensures that the circuit having good bending performance, avoids the use of the costly chip on film and the risk of fracturing wires, increases the folding reliability of the panel, and reduces the cost.

DETAILED DESCRIPTION OF EMBODIMENTS

In order to make the objective, the technical solution and advantages of the present invention more apparent, this disclosure will be further described in detail as below in conjunction with accompanying drawings and embodiments. It is to be understood that the specific embodiments described herein are used merely to explain this disclosure without being used to limit this disclosure.

Figure 1:
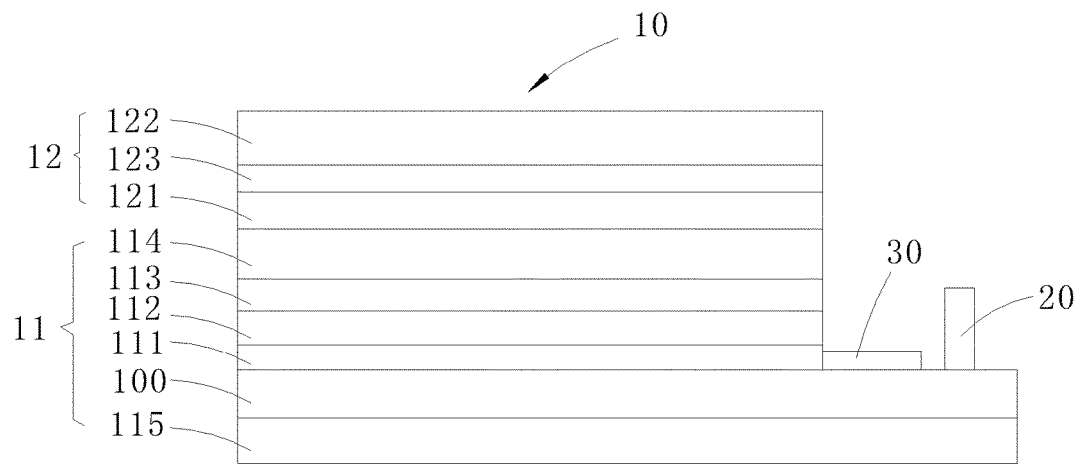
FIG. 1 is a schematic view of the structure of a foldable panel unfolded according to the embodiment of this disclosure.
Figure 2:
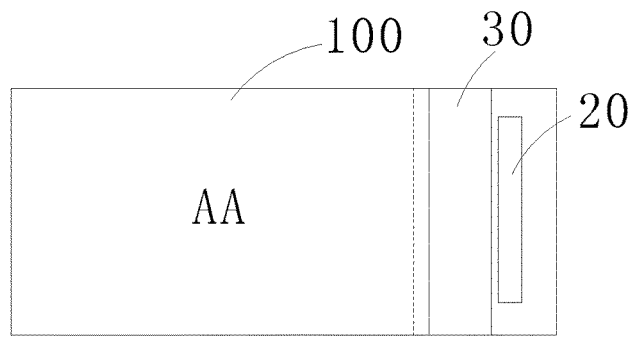
FIG. 2 is a plan view of a foldable panel unfolded according to the embodiment of this disclosure.
Figure 3:
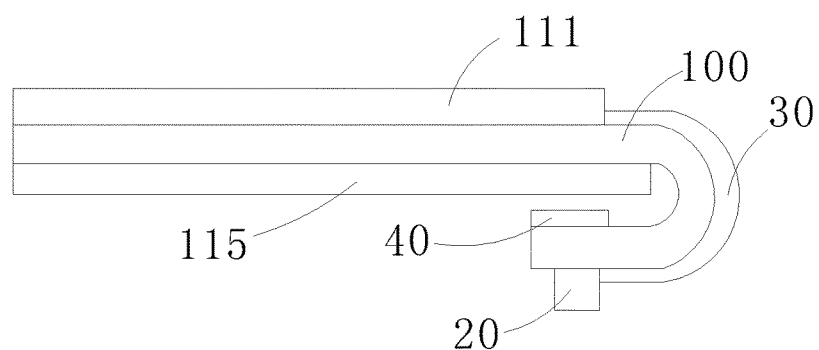
FIG. 3 is a schematic view of a partially structure of a foldable panel bent according to the embodiment of this disclosure.

Referring to FIGS. 1 to 3, a foldable panel of the embodiment of this disclosure includes a flexible display panel 10 and a driver integrated circuit (IC) 20, wherein the flexible display panel 10 uses the flexible substrate 100 as the base substrate, the flexible substrate 100 includes a parts corresponding to the active area and the bonding end of one side of the active area, the driver IC 20 is disposed on the bonding end of the flexible substrate 100 through bonding process, and the bonding end is bent backward to the contrary direction of the light side of the flexible display panel 10, so that the driver IC 20 is finally hidden at the back of the flexible substrate 100; the wires are not disposed on the bending portion of the bonding end, but the flexible substrate 100 is covered with a thin film wiring layer 30 connected between the active area (AA) and the driver IC 20, the conductive wires connected to the flexible display panel 10 and the driver IC 20 respectively is provided on one surface of the thin film wiring layer.

Since the driver IC 20 is finally hidden at the back of the flexible substrate 100, the proportion of the active area of the panel can be the maximum. And since electrical connection to the flexible display panel and the driver IC can be achieved by the conductive wires within the thin film wiring layer, the costly COF (chip on film) way of the prior art can be replaced, and the cost can be saved.

As shown in FIG. 1, the flexible display panel 10 of this embodiment includes a display module 11 and a touch module 11 on the display module 11. The display module 11 includes the flexible substrate 100, and a thin film transistor layer 111, an electroluminescent layer 112, a thin film encapsulation layer 113 and a polarizer 114 are sequentially stacked on the flexible substrate 100. Further, the back surface of the flexible substrate 100 can also be covered with a backplane film 115 for shading and reflection, the backplane film 115 covers the area AA, one side of the flexible substrate 100 side is extended as the bonding end, the driver IC 20 is bound on the bonding end. The touch module 12 includes a touch layer 121, the cover glass 122, and the optical glue 123 filled between the two elements, the touch layer 121 is preferable to use an electronic ink film and is bonded on the polarizer 114. In some embodiments, the flexible display panel 10 may not have the touch module 12, only has a display function.

It can be understood that the thin film wiring layer 30 is used for bridging the panel for the Source, GOA (gate on array) or the like with the output terminal of the driver IC to avoid problems that conductive wires deposited directly on the flexible substrate 100 is frangible, here the good flexible PI (polyimide) material is used on the flexible substrate 100. The driver IC 20 of this embodiment can be directly bonded on the flexible substrate 100, or be bonded on the flexible substrate 100 through the flexible circuit board. A reinforcing plate 40 is further bonded on back side of the bonding end of the flexible substrate 100, the reinforcing plate 40 at least covers the back side of the bonding end where the driver IC is disposed. to ensure the strength of the driver IC 20. After bending the bonding end, the reinforcing plate 40 and the driver IC 20 disposed opposite thereto are hidden in the back of the flexible substrate 100, the free end of the bonding end is substantially parallel to the portion of the flexible substrate 100 in the area AA.

Figure 4:
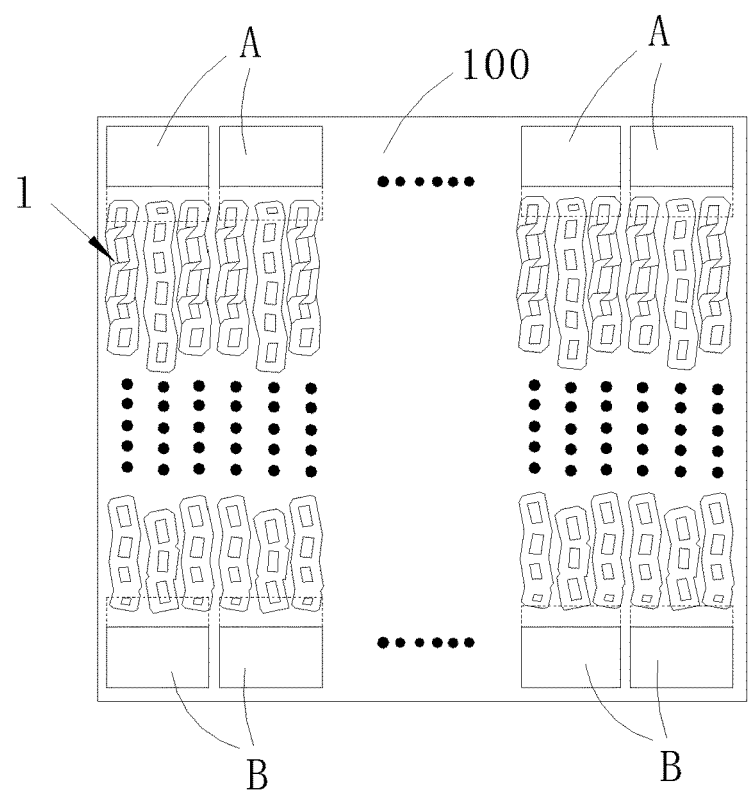
FIG. 4 is a schematic view of bridging of a thin film wiring layer according to the embodiment of this disclosure.
Figure 5:
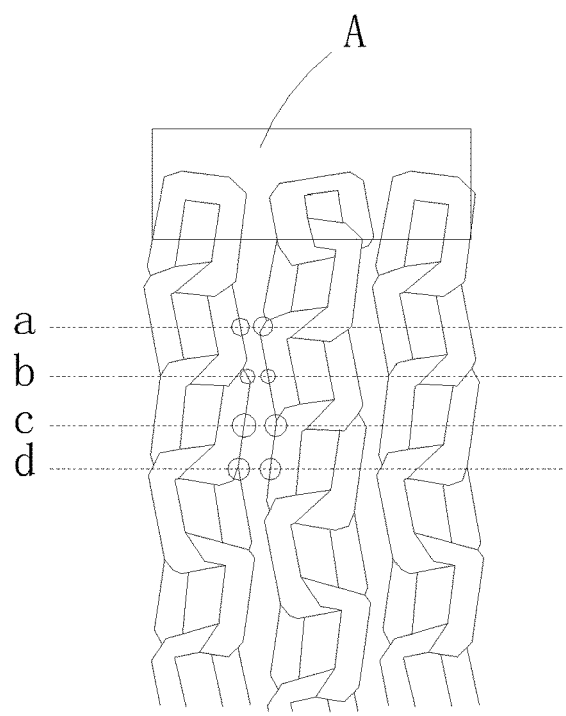
FIG. 5 is a partially enlarged view of FIG. 4.

Here, the conductive wires are disposed at inner surface of the thin film wiring layer 30 and opposite from the flexible substrate 100, and no wire is disposed on outer surface of the thin film wiring layer 30, thus the conductive wires of the bending area can be protected effectively. As shown in FIG. 4, it is a schematic view of bridging of a thin film wiring layer according to the embodiment. As shown in conjunction with FIG. 4, the bonding end of the flexible substrate 100 is provided with a plurality of first bonding terminals A close to the active area and a plurality of second bonding terminals B close to the driver IC, the number of the first bonding terminals A and the second bonding terminals B are the same, the first bonding terminals A are connected to the second bonding ends B one to one through the thin film layer 30, namely one of the first bonding terminals A corresponds one of the second bonding terminals B, the two sets of the bonding ends located at two sides of the bending area are corresponded one to one. Both ends of the thin film wiring layer 30 are correspondingly provided with two sets of bonding ends, which correspond to the first bonding terminals A and the second bonding ends B of flexible substrate respectively. Both ends of each conductive wire are connected to the both ends of the two sets of the bonding ends in the thin film wiring layer 30. By setting an alignment mark at each bonding end, the bonding ends of the flexible substrate 100 can be rapidly bonded with the bonding ends of the thin film wiring layer 30 via the alignment mark, thereby the conductive wires are bonded above the flexible substrate.

Wherein at least two conductive wires are connected between each of the first bonding terminals A and the second bonding terminals B, so that the first bonding terminal A and the second bonding terminal B still can be normally connected when a conductive wire is disconnected, the reliability of the conductive wire is further enhanced. This embodiment is described by taking three conductive wires between each pair of the bonding ends for example. As shown in conjunction with FIG. 5, in this embodiment, each conductive wire 1 is a chain structure formed by a plurality of conductive rings connected to each other, so that each of the conductive wires 1 has some free expansion space, making it difficult to be broken. And connecting parts of two adjacent conductive rings of the conductive wires are staggered. In the longitudinal direction of the conductive wires 1, the connecting part between conductive rings of each conductive wire 1 is the part where stress is concentrated, for example, in FIG. 5, the stress on the bending line b, d of the first and the third conductive wires 1 is most concentrated, and the stress on the bend line a, c is relatively weak, however, the stress on the bending line a, c of the second conductive wire 1 is most concentrated, and the stress on the bend line b, d is relatively weak. By staggering the stress concentrated part of two adjacent conductive wires, namely the stress concentrated part of two adjacent conductive wires is not on the same bending line, this embodiment avoids the stress to be concentrated on the same bending line, and ensures the connectivity of bending part of the conductive wire. At the same time, since the flexible substrate 100 is under the conductive wires of the thin film wiring layer 30, in the bending zone the bottom of the conductive wires is supported by the flexible substrate, the dead-fold bending (bend radius is 0) is avoided, thus the reliability of wire conduction is further guaranteed.

Figure 6:
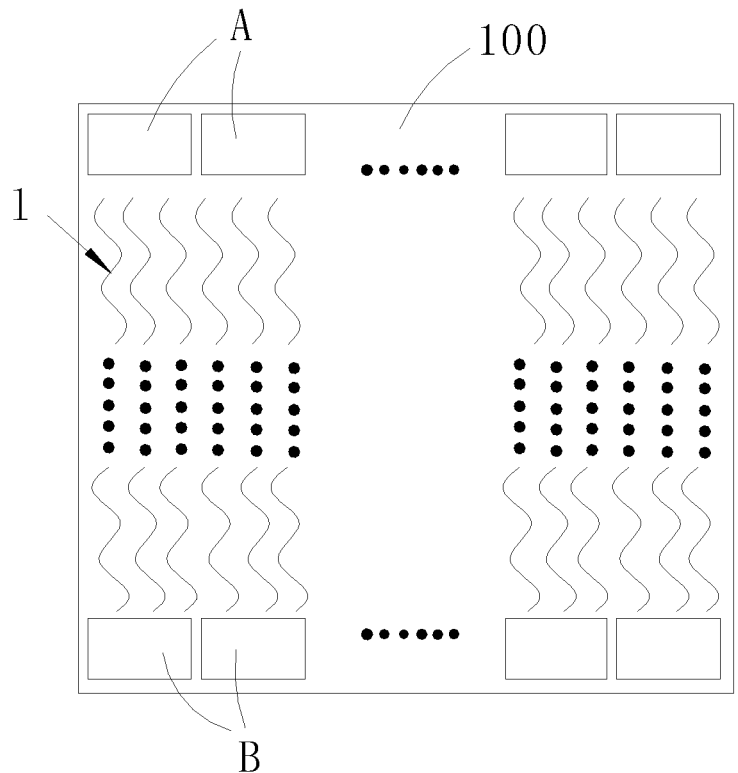
FIG. 6 is a schematic view of bridging of another thin film wiring layer according to the embodiment of this disclosure.

As shown in FIG. 6, it is a schematic view of bridging of another thin film wiring layer according to the embodiment of this disclosure, the conductive wires of this embodiment is wavy shape, can also avoid the phenomenon of stress concentration.

Figure 7:
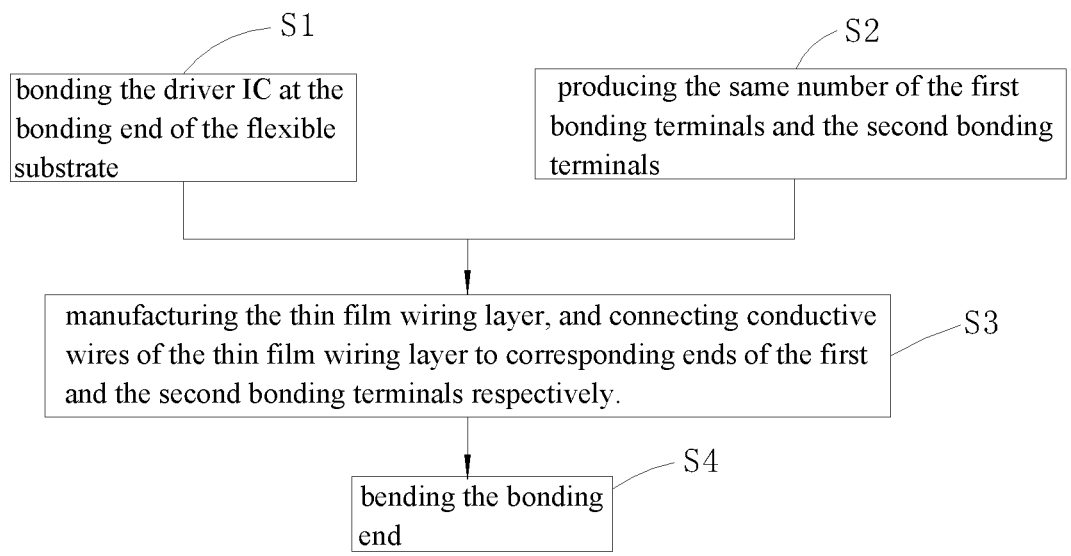
FIG. 7 is a main method of manufacturing a foldable panel according to the embodiment of this disclosure.

As shown in FIG. 7, A method of manufacturing a foldable panel in this disclosure mainly includes the steps of:

S1, bonding the driver IC 20 at the bonding end of the flexible substrate 100;

S2, producing the same number of the first bonding terminals and the second bonding terminals close to the active area and the driver IC 20 respectively at the bonding end of the flexible substrate 100;

S3, manufacturing the thin film wiring layer 30 on the flexible substrate 100, and connecting conductive wires of the thin film wiring layer 30 to corresponding ends of the first and the second bonding terminals respectively;

S4, bending the bonding end, to make the driver IC locate on the back side of the flexible substrate.

Wherein, conductive wires in step S3 is preferably located in the inner surface of the thin film wiring layer 30 and toward the flexible substrate 100, so that the conductive wire will not be exposed, and can be protected at a certain level. The backplane film 115 on the back of the flexible substrate 100 covers the area AA without being extended to the bonding end, and the part corresponding the driver IC 20 at the back side of the bonding end may also be attached to a reinforcing plate 40. In summary, in this disclosure the thin film wiring layer is manufactured on the surface of the bonding end of the flexible substrate, the thin film wiring layer of the bonding end surface of the flexible substrate is used to achieve the electrical connection to the flexible display panel and the driver IC, and the bonding end is bent backward to the contrary direction of the light side to hide the driver IC at the back of the active area, so that the proportion of the active area of the panel can be the maximum; this disclosure also ensures that the circuit having good bending performance, avoids the use of the costly chip on film and the risk of fracturing wires, increases the folding reliability of the panel, and reduces the cost.

The above are only specific embodiments of this application, it should be indicated that this disclosure can also be improved and modified by those skilled in the art without departing from the principle of this disclosure, and these improvements and modifications also fall within the protection scope of the claims of this disclosure.

What is claimed is:

1. A foldable panel, wherein comprising a flexible display panel and a driver IC, the driver IC is arranged at a bonding end of a flexible substrate of the flexible display panel, and the bonding end is bent backward to a contrary direction of a light side of the flexible display panel, so that the driver IC is located at back of the flexible substrate; a thin film wiring layer connected between an active area and the driver IC is further arranged on the flexible substrate, one surface of the thin film wiring layer is provided with conductive wires connected to the flexible display panel and the driver IC respectively;

wherein the bonding end of the flexible substrate is arranged a plurality of first bonding terminals close to the active area and a plurality of second bonding terminals close to the driver IC, the number of the first and the second bonding terminals are the same, the first bonding terminals are connected the second bonding terminals one to one by the thin film wiring layer.

2. The foldable panel according to claim 1, wherein the conductive wires are disposed at inner surface of the thin film wiring layer and opposite from the flexible substrate.

3. The foldable panel according to claim 1, wherein at least two of the conductive wires are connected between each of the first and the second bonding terminals.

4. The foldable panel according to claim 3, wherein the conductive wires are wavy shape.

5. The foldable panel according to claim 3, wherein the conductive wires are chain structures formed of multiple conductive rings connected to each other.

6. The foldable panel according to claim 5, wherein connecting parts of two adjacent conductive rings of the conductive wires are staggered to each other.

7. The foldable panel according to claim 1, wherein the driver IC is directly bonded on the flexible substrate or is bonded on the flexible substrate by a flexible circuit board.

8. The foldable panel according to claim 1, wherein a reinforcing plate is further bonded on back side of the bonding end of the flexible substrate, the reinforcing plate at least covers back side of the driver IC where is disposed on the bonding end.

9. The foldable panel according to claim 1, wherein the conductive wires are wavy shape.

10. The foldable panel according to claim 1, wherein the conductive wires are chain structures formed of multiple conductive rings connected to each other.

11. The foldable panel according to claim 10, wherein connecting parts of two adjacent conductive rings of the conductive wires are staggered.

12. A method of manufacturing a foldable panel, wherein the foldable panel comprises a flexible display panel and a driver IC, the driver IC is arranged at a bonding end of a flexible substrate of the flexible display panel, and the bonding end is bent backward to the contrary direction of light side of the flexible display panel, so that the driver IC is located at back of the flexible substrate; a thin film wiring layer connected between an active area and the driver IC is further arranged on the flexible substrate, one surface of the thin film wiring layer is provided with conductive wires connected to the flexible display panel and the driver IC respectively; the method of manufacturing a foldable panel comprising the steps of:

bonding the driver IC at the bonding end of the flexible substrate;

producing same number of first bonding terminals and second bonding terminals close to the active area and the driver IC respectively at the bonding end of the flexible substrate;

manufacturing a thin film wiring layer on the flexible substrate, and connecting conductive wires of the thin film wiring layer to corresponding ends of the first and the second bonding terminals respectively;

bending the bonding end, to make the driver IC locate on back of the flexible substrate.

13. The method of manufacturing a foldable panel according to claim 12, wherein the conductive wires are disposed at inner surface of the thin film wiring layer and opposite from the flexible substrate.

14. The method of manufacturing a foldable panel according to claim 12, wherein the bonding end of the flexible substrate is arranged a plurality of first bonding terminals close to the active area and a plurality of second bonding terminals close to the driver IC, the number of the first bonding terminals and the second bonding terminals are the same, the first bonding terminals are connected the second bonding terminals one to one by the thin film wiring layer.

15. The method of manufacturing a foldable panel according to claim 14, wherein at least two of the conductive wires are connected between each of the first and the second bonding terminals.

16. The method of manufacturing a foldable panel according to claim 12, wherein the driver IC is directly bonded on the flexible substrate or is bonded on the flexible substrate by a flexible circuit board.

17. The method of manufacturing a foldable panel according to claim 12, wherein a reinforcing plate is further bonded on back side of the bonding end of the flexible substrate, the reinforcing plate at least covers back side of the driver IC where is disposed on the bonding end.

18. The method of manufacturing a foldable panel according to claim 12, wherein the conductive wires are wavy shape.

19. The method of manufacturing a foldable panel according to claim 12, wherein the conductive wires are chain structures formed of multiple conductive rings connected to each other, and connecting parts of two adjacent conductive rings of the conductive wires are staggered to each other.

* * * * *